(12) United States Patent
Grivna

(10) Patent No.: US 8,981,533 B2
(45) Date of Patent: Mar. 17, 2015

(54) ELECTRONIC DEVICE INCLUDING A VIA AND A CONDUCTIVE STRUCTURE, A PROCESS OF FORMING THE SAME, AND AN INTERPOSER

(71) Applicant: Semiconductor Component Industries, LLC, Phoenix, AZ (US)

(72) Inventor: Gordon M. Grivna, Mesa, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 13/968,670

(22) Filed: Aug. 16, 2013

(65) Prior Publication Data

US 2014/0070375 A1 Mar. 13, 2014

Related U.S. Application Data

(60) Provisional application No. 61/700,483, filed on Sep. 13, 2012.

(51) Int. Cl.
*H01L 21/768* (2006.01)
*H01L 23/48* (2006.01)

(52) U.S. Cl.
CPC ........ *H01L 23/481* (2013.01); *H01L 21/76898* (2013.01); *H01L 2224/0557* (2013.01); *H01L 2224/13* (2013.01)
USPC .......................................... 257/621; 438/667

(58) Field of Classification Search
USPC ............................ 257/621; 438/637–640, 667
See application file for complete search history.

(56) References Cited

U.S. PATENT DOCUMENTS

| | | | |
|---|---|---|---|
| 5,501,893 | A | 3/1996 | Laermer et al. |
| 6,621,136 | B2 | 9/2003 | Grivna |
| 6,818,525 | B1 | 11/2004 | Durham et al. |
| 6,841,883 | B1 | 1/2005 | Farnworth et al. |

(Continued)

FOREIGN PATENT DOCUMENTS

| | | |
|---|---|---|
| DE | 102005039068 A1 | 2/2007 |
| JP | 2002043502 A | 2/2002 |

(Continued)

OTHER PUBLICATIONS

European Search Report from EP11169049.1 dated Jan. 17, 2014, 2 pgs.

(Continued)

*Primary Examiner* — Daniel Shook
(74) *Attorney, Agent, or Firm* — Abel Law Group, LLP

(57) ABSTRACT

An electronic device can include a substrate including a first region having a first thickness, and a second region having a second thickness different from the first thickness. The electronic device can include a via within the first region. The electronic device can include a conductive structure adjacent to the first region and connected to the via, wherein a combined thickness of the first thickness and a thickness of the conductive structure is thicker than the second thickness. In another embodiment, an interposer may have a similar structure, with laterally offset conductive structures that allow for lateral routing of electronic signals. A process of forming an electronic device can include forming a via and removing a portion of the substrate. The process can include forming a conductive structure connected to the via, wherein the conductive structure is adjacent to a region where the portion of the substrate has been removed.

20 Claims, 11 Drawing Sheets

(56) References Cited

U.S. PATENT DOCUMENTS

| | | |
|---|---|---|
| 6,984,860 B2 | 1/2006 | Grivna et al. |
| 7,087,925 B2 | 8/2006 | Grivna |
| 7,315,223 B2 | 1/2008 | Margomenos |
| 7,326,629 B2 | 2/2008 | Nagarajan et al. |
| 7,344,959 B1 | 3/2008 | Pogge et al. |
| 7,388,277 B2 | 6/2008 | Pogge et al. |
| 7,411,266 B2 | 8/2008 | Tu et al. |
| 7,452,796 B2 | 11/2008 | Davies |
| 7,485,965 B2 | 2/2009 | Lanzerotti et al. |
| 7,485,968 B2 | 2/2009 | Enquist et al. |
| 7,510,907 B2 | 3/2009 | Heck et al. |
| 7,560,802 B2 | 7/2009 | Kalvesten et al. |
| 7,589,009 B1 | 9/2009 | Kar-Roy et al. |
| 7,589,390 B2 | 9/2009 | Yao |
| 7,608,534 B2 | 10/2009 | Yun et al. |
| 7,611,931 B2 | 11/2009 | Cheng et al. |
| 7,615,462 B2 | 11/2009 | Kim et al. |
| 7,626,269 B2 | 12/2009 | Oliver et al. |
| 7,645,701 B2 | 1/2010 | Anderson et al. |
| 7,670,927 B2 | 3/2010 | Bernstein et al. |
| 7,675,162 B2 | 3/2010 | Foster et al. |
| 7,679,146 B2 | 3/2010 | Tu et al. |
| 7,687,916 B2 | 3/2010 | Lake |
| 7,727,887 B2 * | 6/2010 | Christensen et al. ......... 438/637 |
| 7,741,722 B2 | 6/2010 | Andry et al. |
| 7,803,714 B2 | 9/2010 | Ramiah et al. |
| 7,998,852 B2 | 8/2011 | Jones et al. |
| 8,292,690 B2 | 10/2012 | Seddon |
| 8,357,944 B2 | 1/2013 | Drabe et al. |
| 8,492,260 B2 | 7/2013 | Parsey, Jr. et al. |
| 2003/0113981 A1 | 6/2003 | Combi et al. |
| 2004/0212099 A1 | 10/2004 | Klein et al. |
| 2006/0097357 A1 | 5/2006 | Nemoto |
| 2007/0134819 A1 | 6/2007 | Uchiyama |
| 2008/0105976 A1 | 5/2008 | Pogge et al. |
| 2008/0272499 A1 | 11/2008 | DeNatale et al. |
| 2008/0291601 A1 | 11/2008 | Roozeboom et al. |
| 2009/0001600 A1 | 1/2009 | Somani |
| 2009/0170272 A1 | 7/2009 | Nakamura |
| 2009/0294983 A1 * | 12/2009 | Cobbley et al. ............... 257/774 |
| 2009/0311828 A1 | 12/2009 | Andry et al. |
| 2009/0315188 A1 | 12/2009 | Anderson et al. |
| 2012/0049320 A1 * | 3/2012 | Parsey et al. .................. 257/528 |

FOREIGN PATENT DOCUMENTS

| | | |
|---|---|---|
| WO | 2004084300 A1 | 9/2004 |
| WO | 2007054870 A1 | 5/2007 |

OTHER PUBLICATIONS

Bauer, Thomas, "High Density Through Wafer Via Technology"; Technical Proceedings of the 2007 Nanotechnology Conference & Trade Show, vol. 3; May 20-24, 2007; pp. 116-119; Santa Clara, CA.

Chow, Eugene M. et al.; "Process Compatible Polysilicon-Based Electrical Through-Wafer Interconnects in Silicon Substrates"; Journal of Microelectromechanical Systems; vol. 11, Issue 6.; Dec. 2002; pp. 631-640; IEEE ISSN 1057-7157.

Igic, Petar et al.; "Technology for Power Integrated Circuits with Multiple Vertical Power Devices"; 18th International Symposium on Power Semiconductor Devices & IC's; Jun. 4-8, 2006; Naples, Italy; 4 pages.

Klootwijk, J.H. et al.; "Ultrahigh Capacitance Density for Multiple ALD-Grown MIM Capacitor Stacks in 3-D Silicon"; IEEE Electron Device Letters; Jul. 2008; vol. 29, Issue 7; pp. 740-742; IEEE ISSN 0741-3106.

Savastiouk, Sergey; "Through Silicon Vias (TSV): Design and Reliability"; IEEE Santa Clara Valley Chapter, Components, Packaging, Manufacturing Technology; May 13, 2009; 15 pages.

Vardaman, E. Jan, "3D Packaging and the Future of TSV", Presentation at SEMICON West 2008, 11 pages, TechSearch International, Inc. San Francisco, CA.

U.S. Appl. No. 12/871,390, filed Aug. 30, 2010, "Electronic Device Including a Feature in a Trench", Inventors: John Michael Parsey Jr. et al.

U.S. Appl. No. 13/920,675, filed Jun. 18, 2013, "Electronic Device Including a Feature in an Opening", Inventors: John Michael Parsey Jr. et al.

* cited by examiner

ELECTRONIC DEVICE INCLUDING A VIA AND A CONDUCTIVE STRUCTURE, A PROCESS OF FORMING THE SAME, AND AN INTERPOSER

RELATED APPLICATIONS

This application claims priority under 35 U.S.C. §119(e) to U.S. Patent Application No. 61/700,483 entitled "Electronic Device Including a Via and a Conductive Structure, a Process of Forming the Same, and an Interposer" by Grivna filed Sep. 13, 2012, is related to U.S. patent application Ser. No. 13/920, 675 entitled "Electronic Device Including a Feature in an Opening" by Parsey and Grivna filed Jun. 30, 2013, and is related to U.S. patent application Ser. No. 12/871,390, currently allowed, entitled "Electronic Device Including a Feature in a Trench" by Parsey and Grivna filed Aug. 30, 2010, all of which are assigned to the current assignee hereof and incorporated herein by reference in their entireties.

FIELD OF THE DISCLOSURE

The present disclosure relates to electronic devices and processes of forming electronic devices, and more particularly to electronic devices including features within trenches and processes of forming the same.

RELATED ART

Through-wafer vias are typically used to form connections between different die in a stacked configuration. Such vias can be formed by forming circuitry at one of the major surfaces of a wafer. The wafer is then thinned by backgrinding or other mechanical operation, and then vias are formed though all or substantially all of the remaining thickness of the wafer. Each via has a width that is similar to but slightly smaller than the area occupied by a bond pad. As such, the widths of the vias are 50 microns or larger. The vias consist of bulk silicon, polysilicon, an elemental metal, a metal alloy, a conductive metal nitride, or a combination thereof and do not include a discrete internal feature. In other words, the vias are simple miniature wires. The wafer is singulated to form individual die, and the die can then be stacked such that bond pads of one die are electrically connected to bond pads of another die within the stack because of the vias. The stacked die are attached to a packaging substrate, and the combination of packaging substrate and stacked die are assembled into a completed integrated circuit.

FIG. 1 includes an illustration of top view of a structure 12 used in a prior art electronic device. The structure 12 is used for making electrical connections with the through-wafer vias in applications such as imaging sensors and microscale packaging applications. The structure 12 is formed by etching a die substrate 10 to form a conductive center feature 14 and an annular trench 16 that surrounds the center feature 14. The die substrate 12 and the center feature 14 have substantially the same composition and crystal orientation. The center feature has a typical width of 100 microns, and the trench has a width of 15 microns and a depth of up to several hundred microns. A thermal oxidization is performed to form a liner oxide 18 along the expose sidewalls of the center feature 14 and the annular trench 16. A remaining portion of the annular trench 16 is filled with a dielectric material 19.

BRIEF DESCRIPTION OF THE DRAWINGS

Embodiments are illustrated by way of example and are not limited in the accompanying figures.

Figure 1:
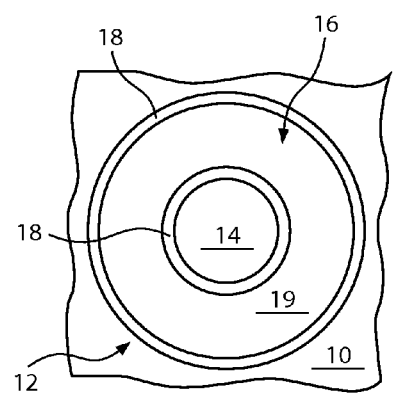
FIG. 1 includes a top view of a structure used in a prior art electronic device. (Prior Art).

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention. To the extent terms defined below are differ from those in U.S. patent application Ser. No. 12/871,390, the terms as defined below govern in this document.

The term "electronic component" is intended to mean to a component that is or can readily be made part of a circuit. An example of an electronic component includes an active component or a passive component, such as a capacitor, resistor, diode, or the like. An electronic component does not include an interconnect, conductive plug, a via, or the like whose function is to electrically connect at least two electronic components or an electronic component and a terminal to each other. The two electronic components or the combination of the electronic component may be on the same substrate or workpiece or on different substrates or workpieces.

An electronic device may or may not include an electronic component. For example, an interposer may be at least a part of an electronic device that may not include any electronic components. The interposer may electrically connect an electronic component on a substrate or workpiece with another electronic component or terminal on a different substrate or workpiece.

The term "metal" or any of its variants when referring to a material is intended to mean to a material, whether or not a molecular compound, that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge, by itself. Group numbers corresponding to columns within the Periodic Table of the elements use the "New Notation" convention as seen in the *CRC Handbook of Chemistry and Physics,* $81^{st}$ Edition (2000-2001).

The term "substantially fills" when referring to a material being formed within an opening or a trench, is intended to mean that most of the opening or trench, or most of a remainder of the opening or trench (if a liner, barrier, or other relatively-thin layer has been previously formed) is filled by the material. Note that an incidental void may be formed when substantially filling the opening or trench with the material. The term "substantially completely fills" is intended to mean that substantially all of the opening or trench or substantially all of the remainder of the opening or trench is filled with the material without a significant number of voids formed within the opening or trench.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can have a region with a relatively thinner portion of a substrate, and another portion of the substrate with a relatively thicker portion. A via can be located within the region having the relatively thinner portion of the substrate. A conductive structure is adjacent to region having the relatively thinner portion and is electrically connected to the via. The conductive structure has a thickness such that an uppermost point of the conductive structure lies at an elevation higher than the relatively thicker portion of the substrate. In a particular embodiment, the conductive structure can include a bump, a solder ball, or another similar structure. The electronic device can also include another conductive structure that is adjacent to an opposite surface of the substrate. The other conductive structure can be electrically connected to the via. In a particular embodiment, the via can be a through-substrate via. If the electronic device has an electronic component at least partly within the substrate, the other conductive structure may be coupled or electrically connected to the electronic component. In an embodiment, the electronic device can include an integrated circuit that is at least partly within the substrate, and in another embodiment, the electronic device can include an interposer with or without an electronic component.

A process of forming the electronic device can include forming the via and then removing a portion of the substrate in a region overlying the via. Thus, the substrate can include a recessed region and another region that is not recessed. The conductive structure can be formed within the recessed region and is electrically connected to the via and extend to an elevation higher than the other portion (not recessed) to allow for a direct chip attach or another solder attach process to a packaging substrate or other workpiece.

The conductive structures along opposite sides of the substrate can be laterally offset from each other to allow for lateral routing (substantially parallel to the thickness of the substrate) of electronic signals in addition to vertical routing (substantially through the thickness of the substrate). Such routing can allow for the conductive structures on the opposite sides of the substrate to have substantially different sizes. Particular electronic devices, processes, and interposers are described in more detail below to illustrate embodiments and not to limit the scope of the present invention. While many numeric values of parameters are described below, such numbers are provided to give skilled artisans some potential embodiments to improve understanding of the concepts described herein. Such values are not to be construed as limiting the scope of the present invention.

Figure 2:
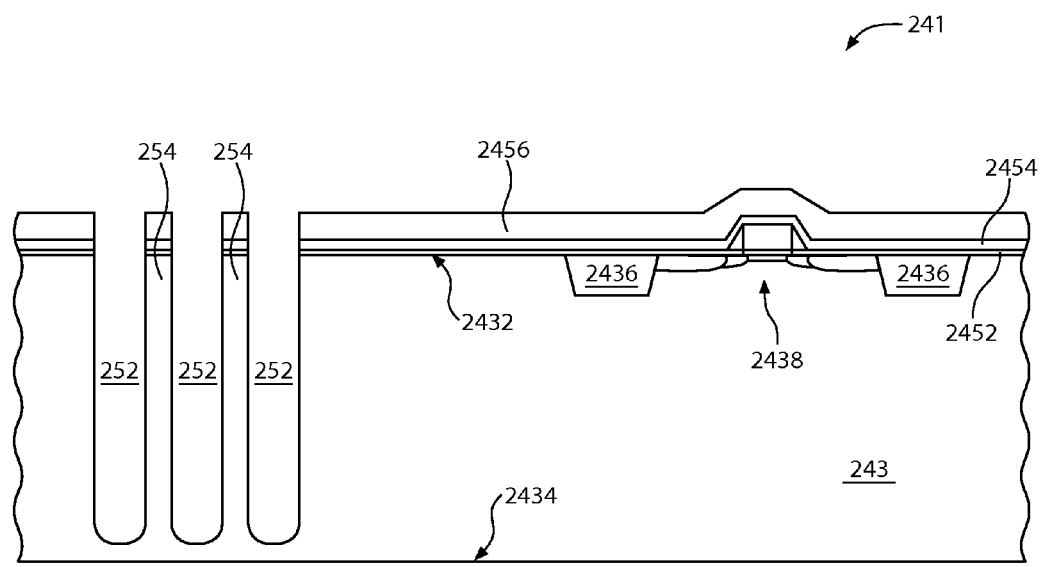
FIG. 2 includes an illustration of a cross-sectional view of a portion of a workpiece after forming trenches within a substrate.

FIG. 2 includes an illustration of a cross-sectional view of a portion of a workpiece 241 that includes a substrate 243. The substrate 243 can include a monocrystalline semiconductor wafer, a semiconductor-on-insulator wafer, a flat panel display (e.g., a silicon layer over a glass plate), or another substrate conventionally used to form electronic devices. The portion of the substrate 243 as illustrated in FIG. 2 includes a Group 14 element (e.g., carbon, silicon, germanium, or any combination thereof) that includes an n-type or p-type dopant. In another embodiment, the die substrate 243 includes a III-V or II-VI semiconductor material.

The substrate 243 includes major surfaces 2432 and 2434 that are separated by an initial thickness. Field isolation regions 2436 and a transistor 2438 can be formed at least partly within the die substrate 243. Other or different active or other electronic components can be are formed within or over the major surface 2432. In a particular embodiment, no electronic components are formed along the major surface 2434 because a subsequent backgrind or other operation will be performed to significantly reduce the thickness of the substrate 243. When the substrate 243 is in the form of a wafer, the initial thickness substantially corresponds to the thickness of the wafer before any processing is performed. In an embodiment, the thickness may be no greater than approximately 2000 microns, and in another embodiment, the thickness may be no greater than approximately 900 microns. In a further embodiment, the thickness is at least approximately 110 microns, and in another further embodiment, the thickness is at least approximately 150 microns. In a particular embodiment, the thickness is in a range of approximately 600 to approximately 800 microns. In another particular embodiment, the substrate 243 has a thickness in a range of approximately 150 microns to approximately 120 microns. In an embodiment, the substrate 243 may have a nominal size (for example, a nominal diameter) of at least 150 cm. Although the substrate 243 does not have a theoretical upper limit, the nominal size of the substrate 243 may not exceed 400 cm.

A pad layer 2452, a stopping layer 2454 (e.g., a polish-stop layer or an etch-stop layer), and a mask layer 2456 are sequentially formed over the substrate 243 using a thermal growth technique, a deposition technique, or a combination thereof. Each of the pad layer 2452 and the stopping layer 2454 can include an oxide, a nitride, an oxynitride, another suitable material, or any combination thereof. In an embodiment, the stopping layer 2454 has a different composition as compared to the pad layer 2452. In a particular embodiment, the pad layer 2452 includes an oxide, and the stopping layer 2454 includes a nitride. A mask layer 2456 is formed over the stopping layer 2454 and is patterned to define openings (not illustrated) under which trenches in the substrate 243 will be formed. In an embodiment, the mask layer 2456 includes an organic resist material, and in another embodiment, the mask layer 2456 may include an inorganic material different from the substrate 243.

An etch operation is performed to pattern the pad layer 2452, stopping layer 2454, and substrate 243 to define trenches, including the trench 252, that extend from the primary surface 2432 towards but does not reach the primary surface 2434. As will be addressed later in this specification, the trench 252 as illustrated in FIG. 2 has three portions that are connected with other portions to form the trench 252. Portions of the substrate 243, including the portion 254, are disposed between portions of the trench 252. In FIG. 2, different segments of the portion 254 are illustrated. The trenches have a depth as measured from the major surface 2432. The depth can be at least approximately 40 microns. In an embodiment, the depth can be at least approximately 75 microns, and in another embodiment, can be at least approximately 110 microns, at least approximately 200 microns, or more. The widths of the portions, including the portion 254, may depend in part on the depth of the trenches. In an embodiment, the width of the portions 254 can be in a range of approximately 0.2 micron to approximately 2 microns, and in a particular embodiment, can be in a range of approximately 0.5 microns to approximately 0.9 microns. Each of the portions of the trench 252 as illustrated in FIG. 2 can be in a range of approximately 0.5 microns to approximately 5 microns, and in a particular embodiment can be in a range of approximately 2.0 micron to 4.0 microns.

The shapes of the trenches can be a little narrower near the bottom of the trench as compared to a location closer to the major surface 2432. Thus, the widths of the features and trenches may be tapered. The bottoms of the trenches are generally flat; however the corners between the sidewalls and bottom of each trench may be rounded. The etch is performed by any number of deep silicon etch tools using an etch process, such as a process as described in U.S. Pat. No. 7,285,228, which is incorporated herein by reference in its entirety. The process disclosed in the patent is a well-known process for high aspect ratio deep silicon etching that cycles between isotropic surface passivation of the trench walls, reactive ion etch passivation clearing at the trench bottom, and isotropic silicon etching of the trench bottom opening. In an embodiment, the selectivity of silicon to an organic resist material can be in a range of approximately 80:1 to 100:1. If a mask uses a metal that is not significantly etched by fluorine, such as an MN mask, the selectivity can be substantially higher. Vertical or tapered or shaped trenches can be controlled by the etching conditions. After forming the trenches, the mask layer 2456 is removed.

The portions 254 of the substrate 243 within the trench 252 correspond to a feature that will be described later in this specification. The feature extends along at least most of the depth of the trench, and in a particular embodiment, extends along substantially all of the depth of the trench. At any particular elevation, the composition and crystal orientation of the features are substantially the same as the substrate 243. Thus, if the substrate 243 is a substantially monocrystalline semiconductor wafer with a (100) crystal plane along the major surface 2432, then the features will also be substantially monocrystalline semiconductor with uppermost surfaces along the (100) crystal plane. If the substrate 243 has a substantially constant doping profile at different elevations along the depth 254 of the trenches, the features will likewise have the same doping profile. If the substrate 243 is a semiconductor-on-insulating wafer (not illustrated) and the trenches 252 extend through the insulating layer, each of the substrate 243 and the features will have substantially the same thicknesses of the semiconductor and insulating layers disposed over a bulk semiconductor substrate.

Figure 3:
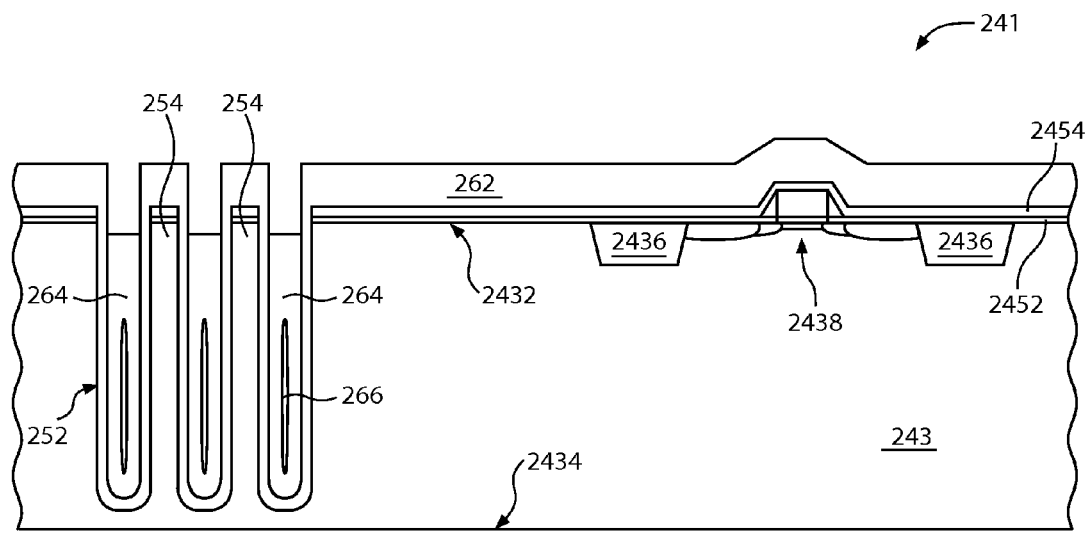
FIG. 3 includes an illustration of a cross-sectional view of the workpiece of FIG. 2 after forming a via.

FIG. 3 includes an illustration of a cross-sectional view of the workpiece 241 after forming an insulating layer 262, filling the trenches with a fill material and partially recessing the fill material to form the via 264. One or more voids 266 may be formed within the via 264. The presence or absence of such void(s) 266 does not significantly affect the performance or reliability of the electronic device. Note that the shapes of the trenches and features as formed may be substantially the same after forming the insulating layer 262 and via 264. In other words, the features do not significantly bend, twist, or otherwise move within the trenches as the trenches are filled. Thus, the movement seen with features of the same general size as used in the prior art can be reduced or even substantially eliminated. As a result, smaller dimensions may be used in the structures, leading to a more efficient use of area.

The insulating layer 262 can be formed to insulate the sidewalls and bottoms of the trenches before forming the fill material. In an embodiment, the insulating layer 262 has a thickness no greater than 900 nm, and in another embodiment, has a thickness no greater than 700 nm. In a further embodiment, the insulating layer 262 has a thickness of at least 11 nm, and in still a further embodiment, the insulating layer 262 has a thickness of at least 100 nm. In a further embodiment, the insulating layer may not be present. The insulating layer 262 can include a single film or a plurality of films, wherein each film can include an oxide, a nitride, or an oxynitride and can be formed thermally or by a deposition. In a particular embodiment, a thermal oxidation is performed to form at least part of the insulating layer 262. When the stopping layer 2454 includes a nitride, the stopping layer 2454 can act as an oxidation barrier to reduce the oxidation of the substrate 243 along the major surface 2432.

The fill material for the via 264 can include a single material or a plurality of materials that can be in the form of layer, a plurality of layers, a single film, or a plurality of films. The fill material can be conductive, resistive, an insulator, or a combination therefore (for example, when forming capacitors within the trenches). The actual material, both composition(s) and number of material(s) will depend on the electronic component being formed. The fill material can be a conductive material and include amorphous silicon, polycrystalline silicon, a metal (an elemental metal, as opposed to a molecular compound), an alloy, a metal nitride, a metal-semiconductor compound, a metal-semiconductor-nitrogen compound, or the like. The composition of the conductive material may depend on when the conductive material is formed. The via 264 may be formed before or after forming electronic components at least partly within the substrate 243. Such electronic components can include an active component (for example, a transistor 2438), a passive component (for example, a resistor, a capacitor, a diode, or the like), or any combination thereof are at least partly formed within the substrate 243. If the conductive material is formed before forming such electronic component within the substrate 243, the conductive material may have to withstand relatively high temperatures, such as greater than 800° C. An exemplary material can include silicon or a refractory metal element. If the conductive material is formed after forming such electronic component within the substrate 243, the conductive material may not need to withstand a temperature greater than 800° C. In a particular embodiment, the conductive material is formed just before or as part of the interlevel dielectric (ILD)/interconnect sequence, and the conductive material may be exposed to temperatures as high as 500° C. An exemplary material can include silicon or a refractory metal element, copper, silver, a noble metal element, or any combination thereof.

The fill material may include an adhesion film, a barrier film, and a conductive-fill film. In a particular embodiment, the adhesion film includes a refractory metal, the barrier layer includes a refractory metal nitride, and the conductive-fill film includes a refractory metal different from the adhesion film. In another particular embodiment, the fill material includes doped polysilicon.

The fill material can be formed by depositing the fill material using a chemical vapor deposition, physical vapor deposition, plating, coating, another suitable technique, or any combination thereof. In a particular embodiment, the fill material is deposited conformally. The thickness of the fill material is sufficient to substantially fill the trenches, including the trench 252, and in a particular embodiment, the fill material substantially completely fills the trenches. The actual thickness may depend on the width of the trenches. As the trenches are wider, a thicker deposition of the fill material may be needed. In an embodiment, the thickness will be at least half of the width, and can be thicker to account for nonuniformity of the widths of the trenches, thickness of the fill material across the substrate 243, or both. In a particular embodiment, the thickness of the fill material may be approximately 0.9 micron when the widths of the trenches are approximately 1.6 microns. In another particular embodiment, the thickness of the fill material may be approximately 1.5 micron when the widths of the trenches are approximately 2.8 microns. After reading this specification, skilled artisans will appreciate that making the fill material too thick is safer than making the fill material too thin. However, as the thickness increases, longer deposition times, higher costs for the fill material, and longer and more costly subsequent removal operations will result. Accordingly, in an embodiment, the thickness of the fill material is no thicker than approximately three times the width of the widest trench, and in another embodiment, the thickness of the fill material is no thicker than approximately twice the width of the widest trench. As deposited, the fill material will overlie the pad layer 2452 and the stopping layer 2454 (not illustrated).

A removal operation is performed to remove a portion of the fill material that overlies the stopping layer 2454. The removal operation can be performed using an etching or polishing technique or using a patterned etch process to leave a conductive routing layer over the stopping layer 2454 (not illustrated). The tops of the remaining portions of the fill material may be recessed below the exposed surface of the stopping layer 2454. In a particular embodiment, the fill material is recessed to an elevation at or near the elevation of the primary surface 2432

Figure 4:
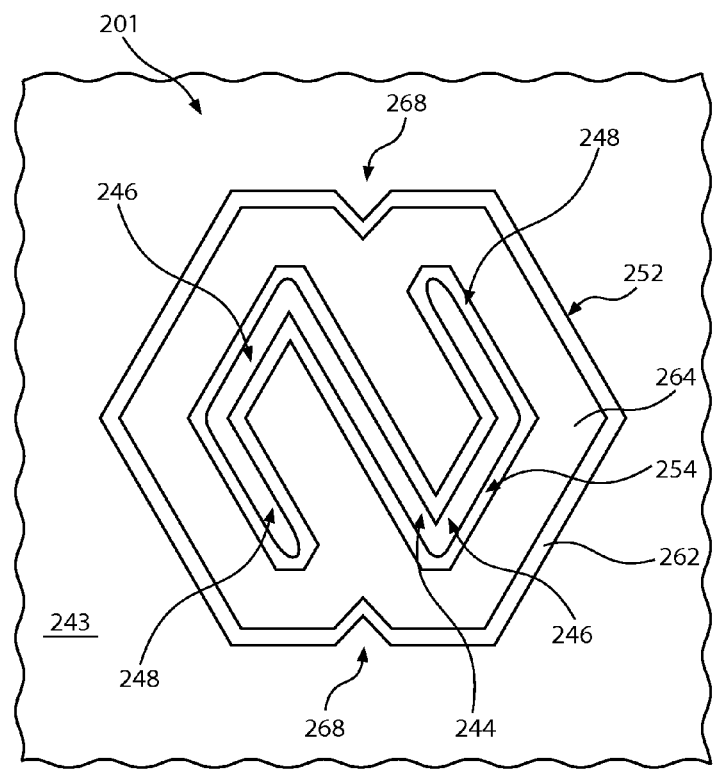
FIG. 4 includes an illustration of a top view of a via structure in accordance with a particular embodiment.

FIG. 4 includes a top view of the structure that includes the via 264 in accordance with a particular embodiment. The trench 252 has a generally hexagonal shape. Within the trench 252 is a generally S-shaped feature 254 that has a center segment 244 and segments 248 that are substantially parallel to one another. Two intermediate segments 246 are substantially parallel to each other and connect the center segment 244 to the segments 248. FIGS. 2 to 23 in US 2012/0049320 illustrate other shapes for trenches and features within the trenches that can be used with the concepts as described within this specification. In an embodiment, outwardly-extending, space-compensating elements 268, such as notches, are along opposite sides of the trench 252 and extend outwardly from the substrate 243. The outwardly-extending, space compensating elements 268 are configured to make distances between the substrate 243 and S-shaped feature 254 more equal as compared to the substrate 243 and S-shaped feature 254 in an absence of the outwardly-extending, space-compensating elements 268. The insulating layer 262 and the via 264 are also illustrated. Outside of the trench 252 is the substrate 243.

Figure 5:
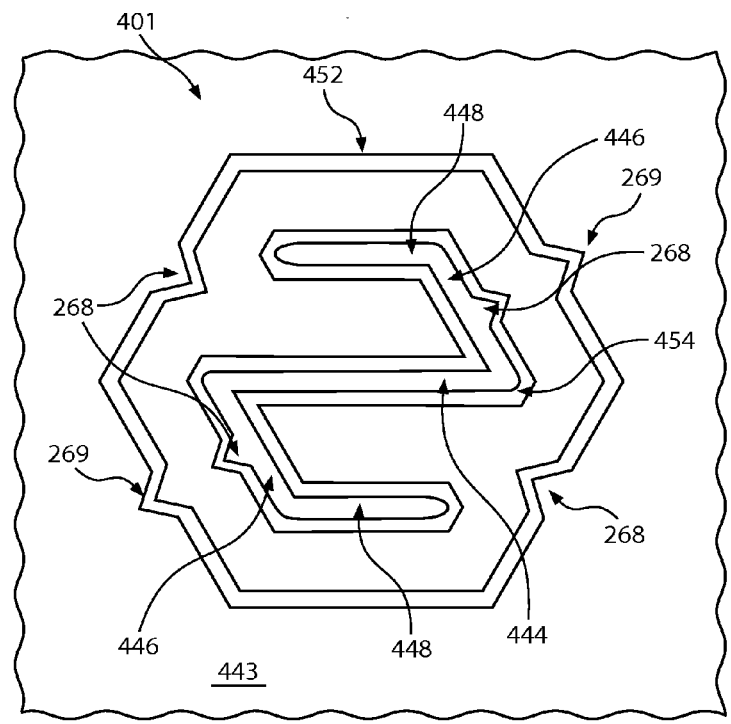
FIG. 5 includes an illustration of a top view of a via structure in accordance with an alternate particular embodiment.

FIG. 5 includes a top view of another embodiment of the structure that includes a via that is similar to the via in FIG. 4. In this particular embodiment, a trench 452 comprises both outwardly-extending, space-compensating elements 268 that extend outward from the substrate and inwardly-extending, space-compensating elements 269 that extend inwards into the substrate. Within the trench 452 is a generally S-shaped feature 454 that has a center segment 444 and segments 448 that are substantially parallel to each other. In another embodiment, segments 448 are not substantially parallel to each other. Two intermediate segments 446 are substantially parallel to each other and connect the center segment 444 to segments 448. The S-shaped feature 454 further comprises the outwardly-extending, space-compensating elements 268 extending outwards into the substrate 443. The outwardly-extending, space-compensating elements 268 and the inwardly-extending, space-compensating elements 269 are configured to make distances between the substrate 443 and S-shaped feature 454 more equal as compared to the substrate 443 and the S-shaped feature 454 in an absence of the outwardly-extending, space-compensating elements 268 and the inwardly-extending, space-compensating elements 269. Additionally, each of the outwardly-extending, space-compensating elements 268 and the inwardly-extending, space-compensating elements 269 provide further mechanical support for S-shaped feature 454.

Figure 6:
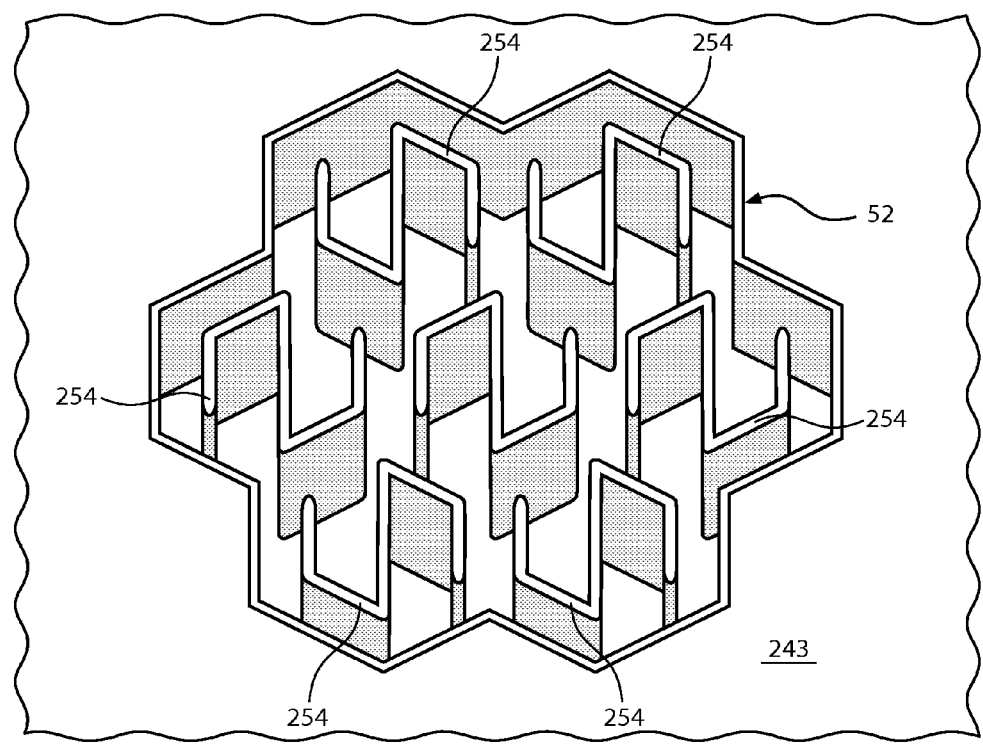
FIG. 6 includes an illustration of a top view of a portion of a substrate after forming a trench is accordance with another particular embodiment.

The trench 252, feature 254, and via 262 illustrated in FIG. 4 can represent a unit cell 201. The trench 452, 454, and 464 illustrated in FIG. 5 can represent a unit cell 401. The unit cells 201 and 401 can be replicated to form a larger via. FIG. 6 includes a top view (at a slight off-angle) of a trench 52 and S-shaped features 254. The different segments within each of the S-shaped features 254 help provide the stability for the S-shaped features 254 such that it resists motion prior to the trench being filled with the fill material and provide a uniform gap for the subsequent filling material. An insulating layer and via, similar to the insulating layer 262 and via 264, can be formed within the trench 52.

Processing continues until the processing along the one side of the electronic device is substantially completed. An insulating layer 272 is formed over the substrate 243 in FIG. 7. The insulating layer 272 can include one or more films of an oxide, a nitride, an oxynitride, or any combinations thereof. A combined thickness of the insulating layers 262 and 272 can be in a range of approximately 0.5 to approximately 3 microns. Portions of the insulating layers 262 and 272 are removed to define contact openings in which conductive plugs 274 and 276 are formed. The conductive plugs 274 make electrically connections to the electronic components, such as the transistor 2438. The conductive plug 276 makes electrical connection to the via 264. Interconnects 275 and 277 are formed and electrically connected to the conductive plugs 274 and 276, respectively. Interconnects are conductors that electrically connect the electronic components to one another or to other features along the same side of a substrate. Although not illustrated, the interconnect 277 may be electrically connected to the transistor 2738 or another electronic component that is at least partly within or over the substrate 243. Additional insulating and interconnect levels (not illustrated in FIG. 7) can be formed if needed or desired. An insulating layer 279 is formed over the uppermost level of interconnects. The insulating layer 279 can include one or more films including an oxide, a nitride, an oxynitride, or any combination thereof. In another embodiment, the insulating layer 279 can include an organic material, such as a polyimide.

Figure 7:
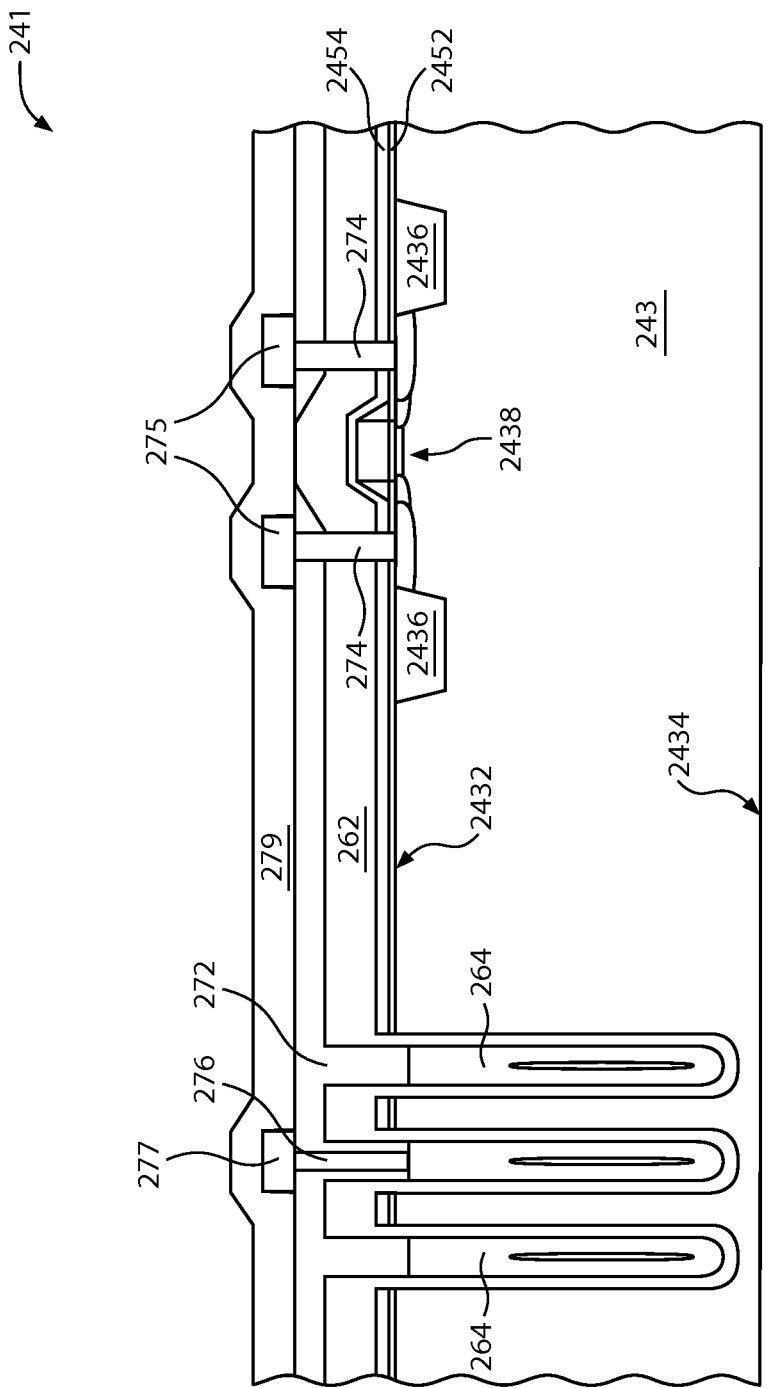
FIG. 7 includes an illustration of a cross-sectional view of the workpiece of FIG. 3 after forming conductive plugs, interconnects, and an insulating layer.
Figure 8:
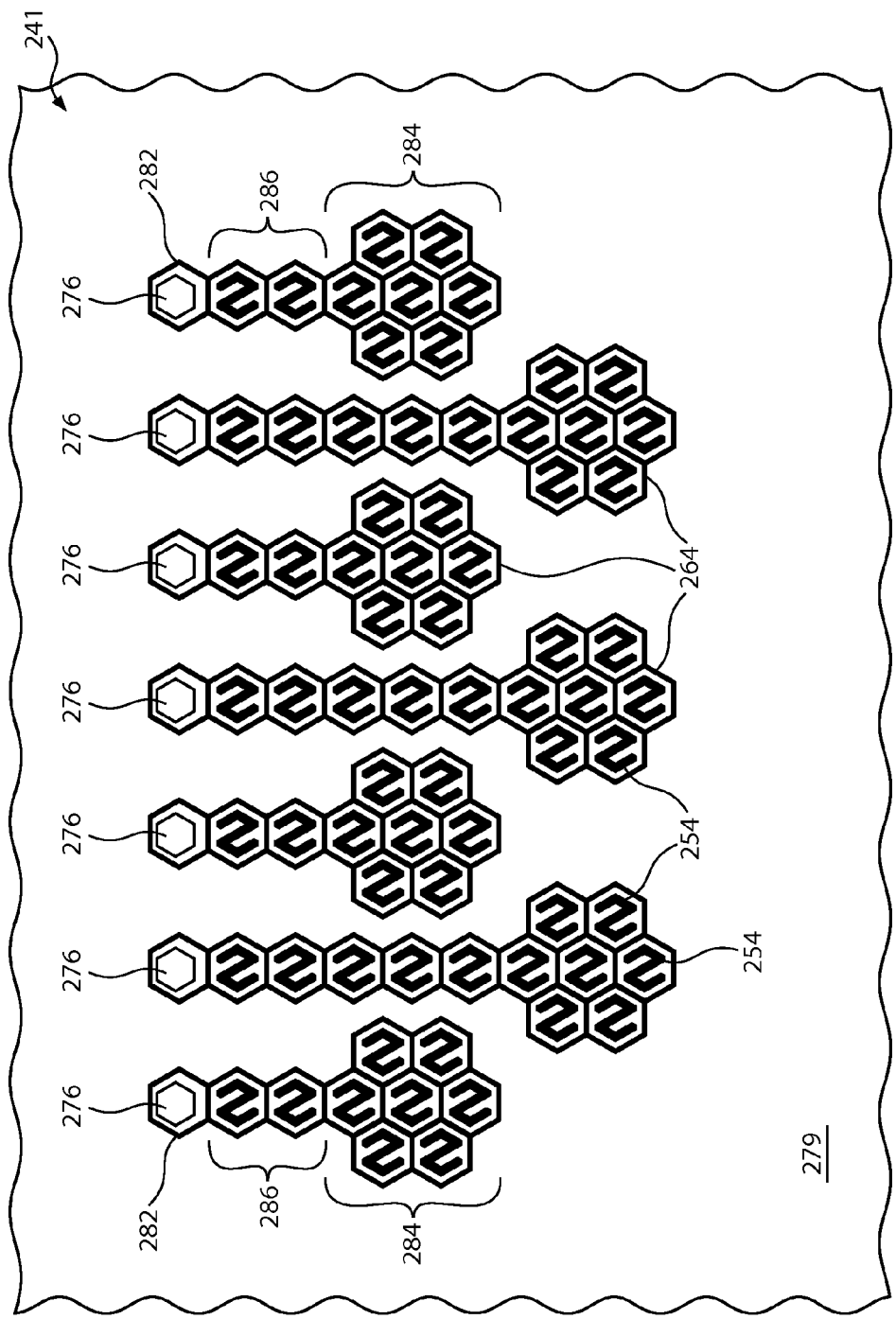
FIG. 8 includes an illustration of a top view of vias formed in accordance with an embodiment.
Figure 9:
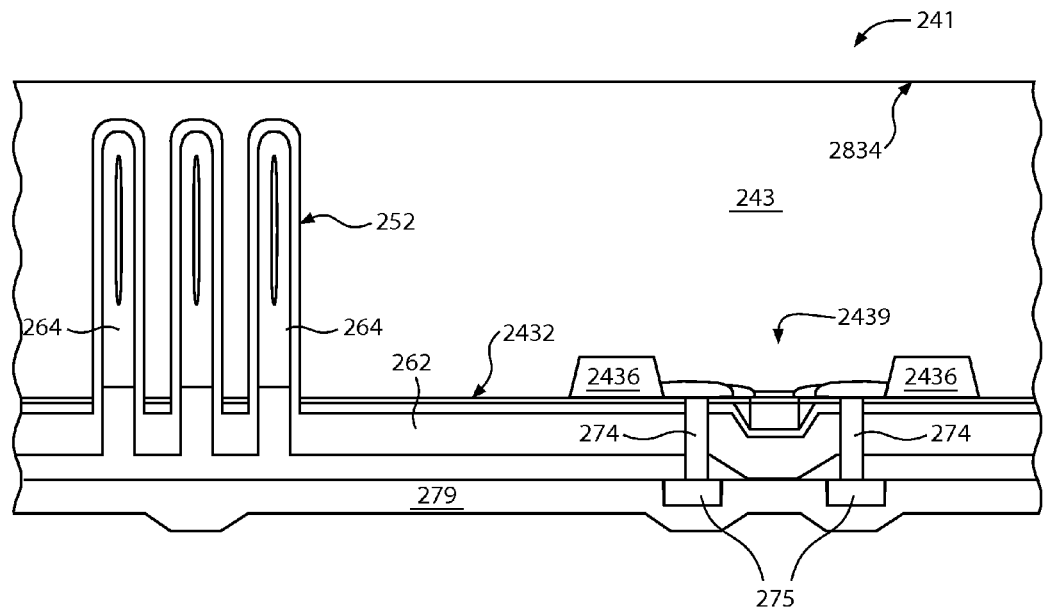
FIG. 9 includes an illustration of a cross-sectional view of the workpiece of FIG. 7 after inverting the workpiece and reducing the thickness of the substrate.

FIG. 8 includes a top view of the workpiece 241 at a different location. The view in FIG. 8 would be looking down at the insulating layer 279 as illustrated in FIG. 7. Interconnects 277 and 275 are not illustrated to simplify the positional relationships between the conductive plugs 276 and the vias 264. In the embodiment as illustrated in FIG. 8, each of the vias 264 includes distinct segments, each of which is contiguous with one or more other distinct segments. Each segment, including segments 282, includes one of the features 254 as well as portions of the insulating layer 262 and the conductive material of the via 264 (not illustrated in FIG. 8). Segments 282 are electrically connected to the conductive plugs 276, which are a type of conductive structure. In another embodiment where the conductive plugs 276 are not used, the interconnects 277 may directly contact the segments 282 instead of the conductive plugs 276 directly contacting the segments 282. The sets of segments 284 are at locations over which other conductive structures will be subsequently formed adjacent to the other side of the substrate 243. The sets of segments 286 are a series of distinct segments that are between the segments 282 and the sets of segments 284. The sets of segments 286 can help to route the vias 264 so that larger conductive structures can be used along the opposite side of the substrate 274. In this particular embodiment, the sets of segments 284 are staggered relative to one another. In another embodiment, one or more sets of segments 286 may extend in different directions as compared to another set of segments 286, and thus, may not have lengths be parallel to each other The workpiece 241 is turned over so that the primary surface 2434 (in FIG. 7) is facing upwards. FIG. 9 illustrates the workpiece 241 after a portion of the substrate 243 is removed to provide a new primary surface 2834 that is substantially parallel to the primary surface 2432. Note that the illustration in FIG. 9 is at a location where the set of segments 286 (in FIG. 8) are located. Thus, another electronic component, a transistor 2439, is in FIG. 9.

The removal of the portion of the substrate 241 can be performed using a single operation or a plurality of operations. In an embodiment, the removal can be performed using a relatively fast, nonselective removal technique, such as backgrinding, polishing, or the like. In an embodiment, the thickness of the substrate 243 can be sufficiently thick enough so that the workpiece 241 does not excessively bow or otherwise become significantly non-planar. Thus, a handle substrate does not need to be attached to the workpiece 241 to keep the workpiece 241 planar or otherwise allow the workpiece 241 to be subsequently handled by machinery. The thickness of the substrate 243 may be no greater than approximately 200 microns, no greater than approximately 170 microns, no greater than approximately 150 microns, or potentially thinner. The actual thickness selected may depend on the nominal size of the substrate 243, the stress on the substrate 243 due to other layers that are currently present, thermal cycles, and potentially other factors. In another embodiment, a substrate may already have a desired thickness. For example, the electronic device can be an interposer that has its desired thickness.

Figure 10:
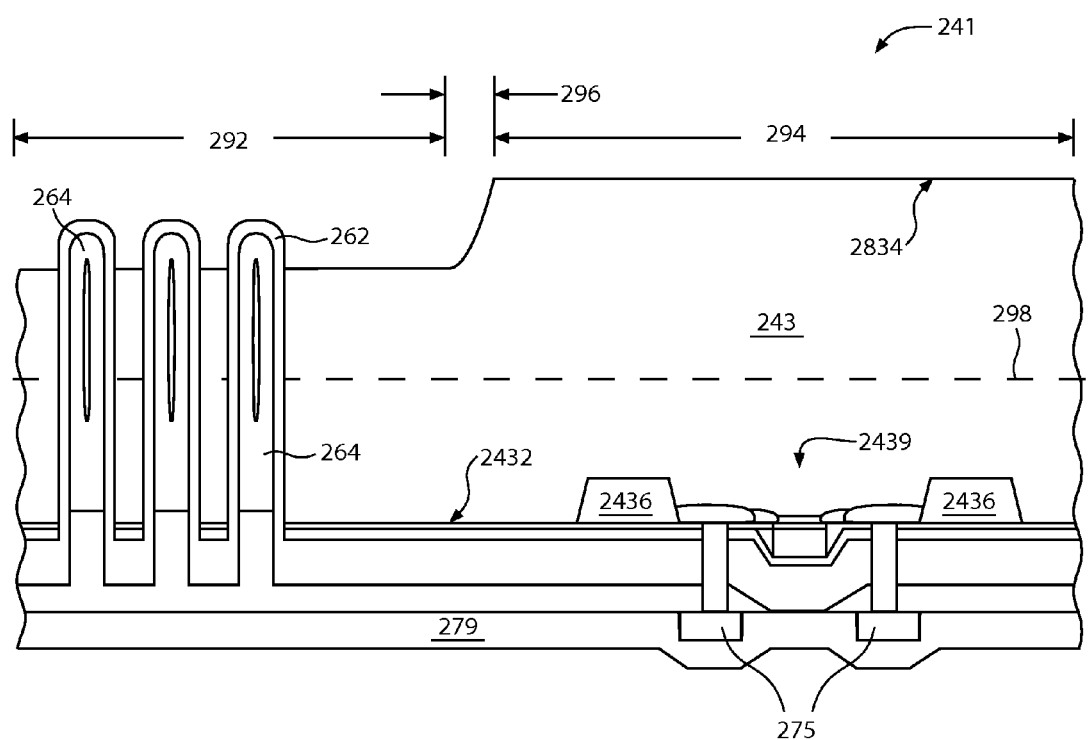
FIG. 10 includes an illustration of a cross-sectional view of the workpiece of FIG. 9 after further reducing the thickness of the substrate within a region with a via.

FIG. 10 includes an illustration where the substrate 243 has been thinned in a region 292 where the via 264 is located. In a region 294, substantially none of the substrate 243 is removed, and a region 296 is a transition region between the regions 292 and 294. A mask layer (not illustrated) is formed over the region 294, and the region 292 is exposed. Referring to FIG. 9, the amount of the substrate 243 to be removed from the region 292 can depend on the thickness of the substrate 243 before patterning, the depth of the trenches 252, the thickness of the insulating layer 262, and potentially another factor. The substrate 243 within the region 292 is etched to expose portions of the insulating layer 262. Ends of the via 264 lie at an elevation, as measured from a central elevation along a central plane 298 between the primary surfaces 2432 and 2834 of the substrate 241, that is greater than an elevation of the substrate 243, as measured from the central elevation, within the region 292. The thickness of the substrate 243 within the region 294 is thicker than the thickness of the substrate 243 within the region 292.

In an embodiment, at least approximately 1.1% of the thickness of the substrate 243 is removed within the region 292, and no greater than approximately 90% of the thickness of the substrate 243 is removed within the region 292. In another embodiment, the thickness of the substrate 243 removed is in a range of approximately 11% to approximately 50% of the thickness of the substrate 243 within the region 292, and in another embodiment, in the thickness of the substrate 243 removed is in a range of approximately 20% to approximately 40% of the thickness of the substrate 243 within the region 292. In a further embodiment, a remaining thickness of the substrate 243 within the region 292 can be at least approximately 30 microns, at least approximately 80 microns, at least 130 microns, or even thicker.

The region 294 helps to provide mechanical support for the workpiece 241. When expressed as a percentage of area of the workpiece 241 (as seen from a top view), the region 294 occupies at least approximately 10%, at least approximately 50%, or at least approximately 70% of the area. In an embodiment, the region 294 may occupy no greater than approximately 99%, no greater than 95%, or no greater than 91% of the area. All or substantially all of the remaining area is occupied by the region 292. The region 296 can occupy less than 1% of the area of the workpiece 241.

An etch to remove the portions of the substrate 243 can be performed as an isotropic or anisotropic etch. An isotropic etch may help improve step coverage for subsequent layers that are formed. An isotropic etch would provide for the transition region 296, and an anisotropic etch may not provide for any significant transition region. The mask layer is removed after the etch.

At this point in the process, the remaining portions of the substrate 243 (that are parts of the feature 254 in FIG. 3) within the via 264 are spaced apart from and no longer connected to the main body of the substrate 243 within the region 294.

Figure 11:
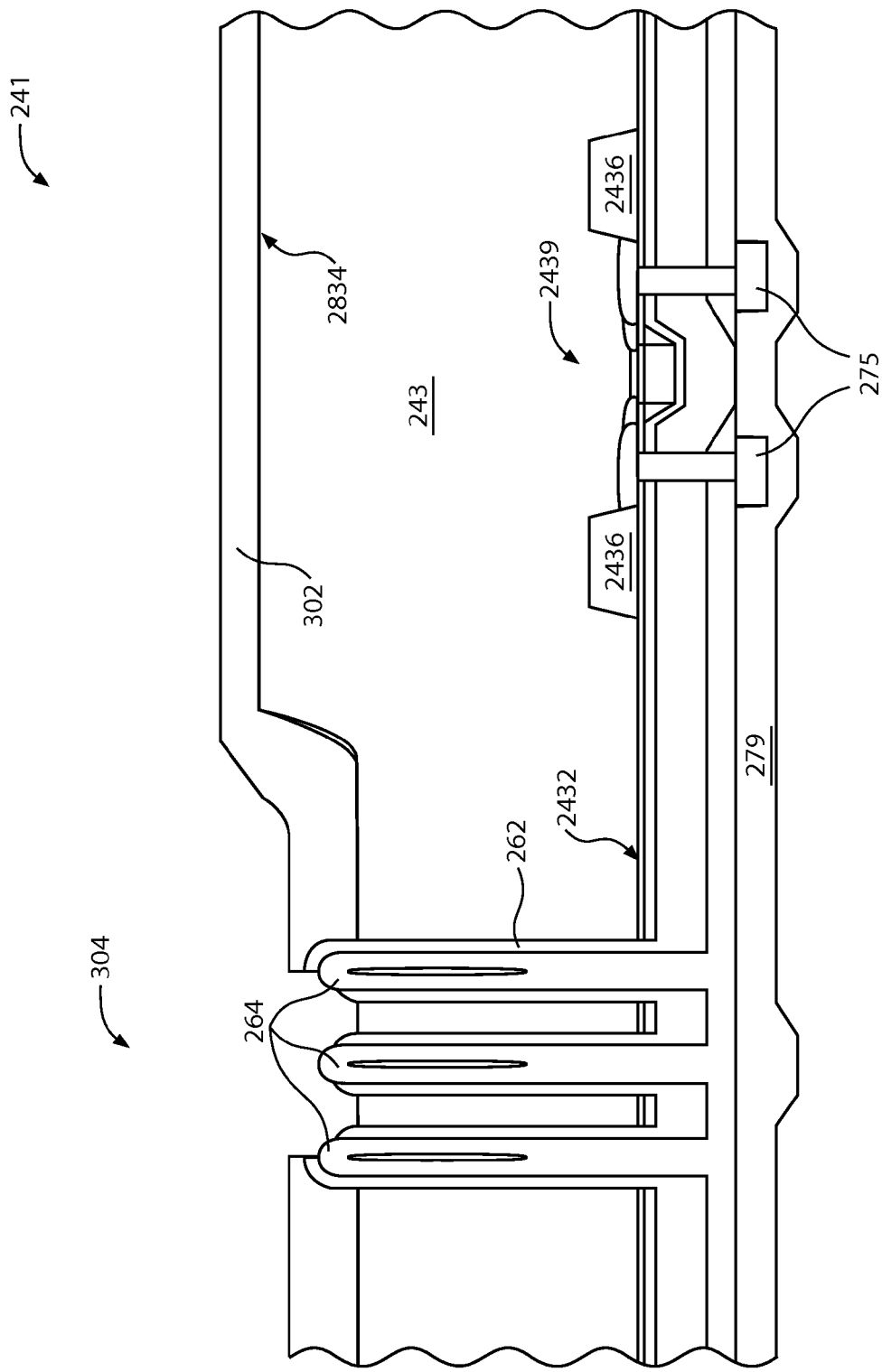
FIG. 11 includes an illustration of a cross-sectional view of the workpiece of FIG. 10 after forming a patterned insulating layer and exposing portions of the via.

A patterned insulating layer 302 is formed over the substrate 243 and defines an opening 304 over the via 264, as illustrated in FIG. 11. The patterned insulating layer 302 can include one or more films of an oxide, a nitride, an oxynitride, or any combination thereof. In another embodiment, the patterned insulating layer 302 can include a polymer that is coated over the exposed surface of the workpiece 241. In a particular embodiment, the patterned insulating layer 302 can include a photo-definable material. The opening 302 exposes portions of the insulating layer 262 that are removed to expose portions of the via 264. The removal can be performed by etching the insulating layer 262.

Figure 12:
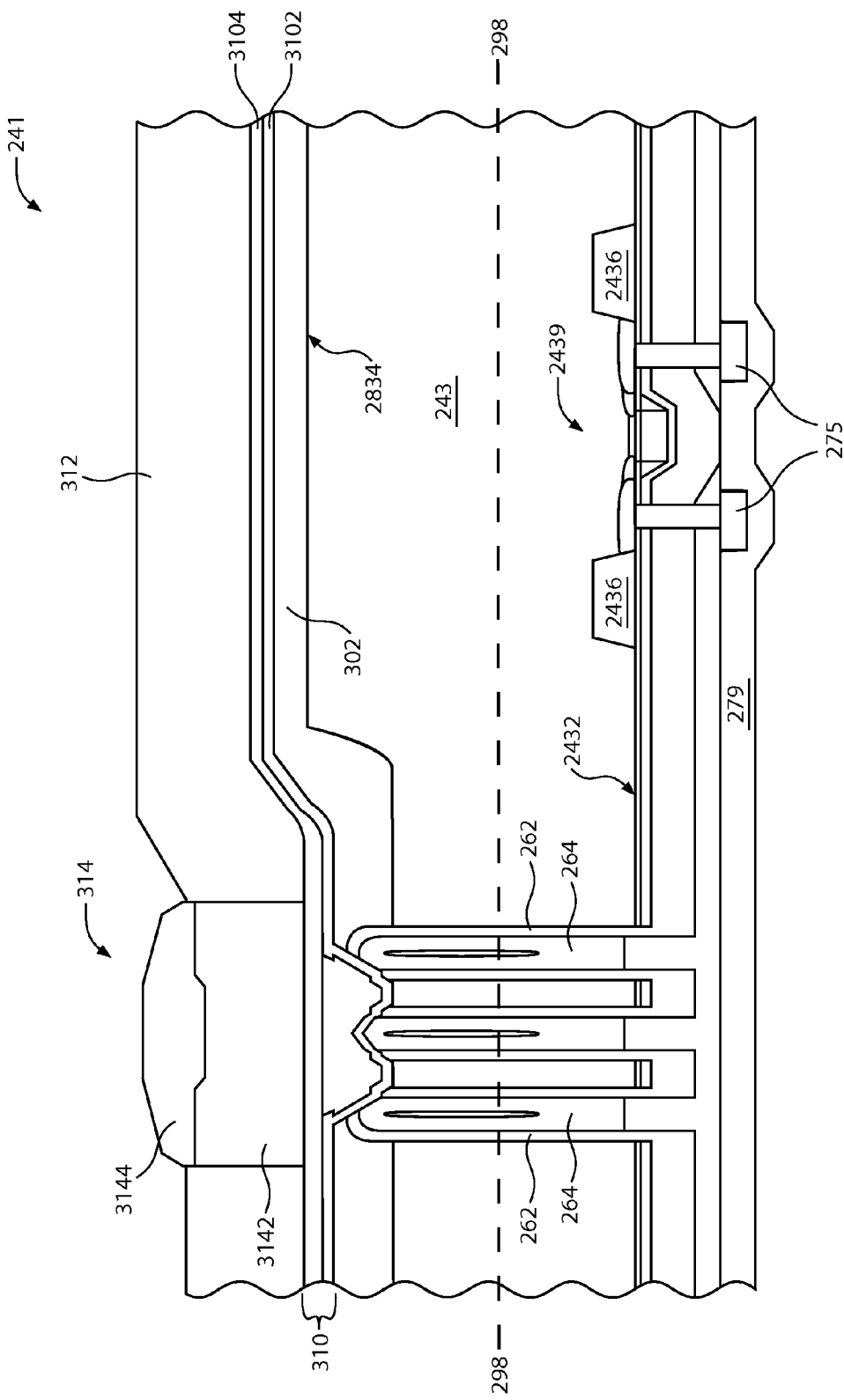
FIG. 12 includes an illustration of a cross-sectional view of the workpiece of FIG. 13 after forming a conductive layer, a mask layer, and a conductive bump.

As illustrated in FIG. 12, a conductive layer 310, a mask layer 312, and a conductive bump 314 are formed along the workpiece 241. The conductive layer 310 can be part of underbump metallurgy and can include one or more films. In a particular embodiment, an adhesion film 3102 helps the conductive bump 314 to adhere better to insulating materials, such as portions of insulating layers 262 and 302. The adhesion file 3102 can include titanium, tantalum, another suitable metal, or any combination thereof. A seed film 3104 can help to promote plating of a conductive material within the conductive bump 314. The seed film 3104 can be the same material as or different material from the conductive bump 314. The seed film 3104 can include copper, a noble metal, or any combination thereof. In an embodiment, the thickness of the conductive layer 310 can in a range of approximately 50 to 900 nm, and in a particular embodiment, can be in a range of approximately 70 nm to approximately 200 nm. Other thicknesses can be used if needed or desired.

The mask layer 312 defines openings where the conductive bumps, such as conductive bump 314, are formed. In an embodiment, the openings are within region 292 (as illustrated in FIG. 10). In a particular embodiment, the mask layer 312 may be a laminated layer. In another embodiment, the mask layer 312 can be deposited and patterned. The mask layer 312 includes an insulating material so that the conductive material within the conductive bumps is not formed over substantially all of the mask layer 312. During formation of the conductive bumps, some conductive material (overflow material) may be deposited onto the mask layer 312, but the overflow material will be near the openings and does not adversely affect the performance of the electronic device.

A conductive layer 3142 and a solder layer 3144 are deposited within the openings to form the conductive bumps, such as the conductive bump 314. The conductive layer 3142 may be electroplated over exposed portions of the seed film 3104. The conductive layer 3104 can include copper, a noble metal, or any combination thereof. In an embodiment, the conductive layer 3142 can have a thickness greater than approximately 5 microns, greater than 20 microns, or greater than 40 microns. Although there is no theoretical upper number of the thickness, the conductive layer 3142 may have a thickness no greater than approximately 900 microns, no greater than approximately 500 microns, or no greater than approximately 95 microns. The solder layer 3144 can include a metal or a metal alloy that may flow at a temperature no greater than approximately 300° C., so that the solder layer 3144 can flow (typically referred to as reflowing) and form an electrical connection to a different die, a packaging substrate, a printed wiring board, or the like. The solder layer 3144 can include lead, indium, tin, another suitable material having desired flow characteristics, or any combination thereof. The thickness of the solder layer 3144 can be any of the thicknesses as previously described with respect to the conductive layer 3142. The solder layer 3144 can be significantly thinner than the conductive layer 3142 and have a thickness that is in a range of approximately 5% to approximately 50% of the thickness of the conductive layer 3142.

Figure 13:
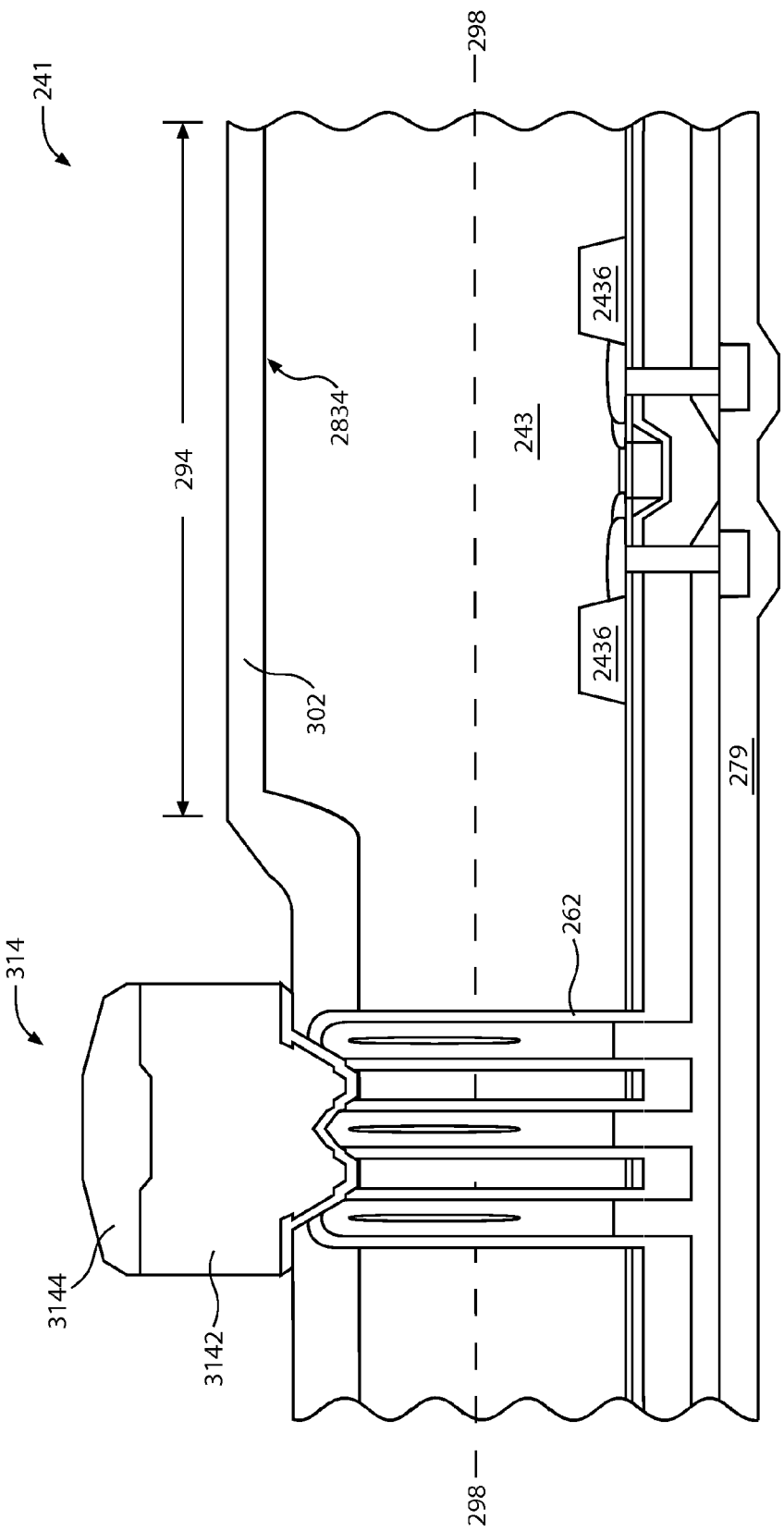
FIG. 13 includes an illustration of a cross-sectional view of the workpiece of FIG. 12 after removing the mask layer and portions of the conductive layer not covered by the conductive bump.

The mask layer 312 and portions of the conductive layer 310 not covered by the conductive bumps are removed as illustrated in FIG. 13. The conductive bumps can be subjected to a sufficiently high enough temperature to cause the solder layer 3144 to flow as illustrated in FIG. 13. The uppermost points of solder layer 3144, the conductive layer 3142, or both may be at elevations, as measured from the central elevation, that are higher than the elevation of the primary surface 2834, the insulating layer 302, or both, within the region 294. Such elevation differences can allow for easier alignment to terminals of a packaging substrate, a printed wiring board, or another workpiece.

In another embodiment, the conductive bumps can be formed using a deposition technique, without the use of the conductive layer 310 or the mask 312. In an embodiment, a stencil mask (not illustrated) is placed over the substrate 243, wherein the stencil mask has openings where conductive bumps, similar to the conductive bump 314, are to be formed. The combination of the workpiece and stencil mask is placed into a deposition tool, and the underbump metallization and bump metallization can be sequentially deposited to form the conductive bumps. The use of the stencil mask may eliminate the need of a separate patterning step when forming the conductive bumps.

In still another embodiment, a lift-off process can be used. After forming the workpiece as illustrated in FIG. 11, a patterned resist layer can be formed such that openings defined by the resist layer overlie the openings where conductive bumps are to be formed. Underbump metallization can be deposited over the patterned resist layer and within the openings in the patterned resist layer and the openings. The patterned resist layer can be removed along with a portion of the underbump metallization overlying the patterned resist layer. Portions of the underbump metallization can remain in the openings. The bump metallization can be formed over the underbump metallization to form the conductive bumps. In a particular embodiment, the conductive bumps can be selectively formed over the underbump metallization, such as selective plating.

In a further embodiment, solder balls can be used in place of the conductive bumps. Each of the conductive bumps and the solder balls are examples of conductive structures that can directly contact the vias 262.

Figure 14:
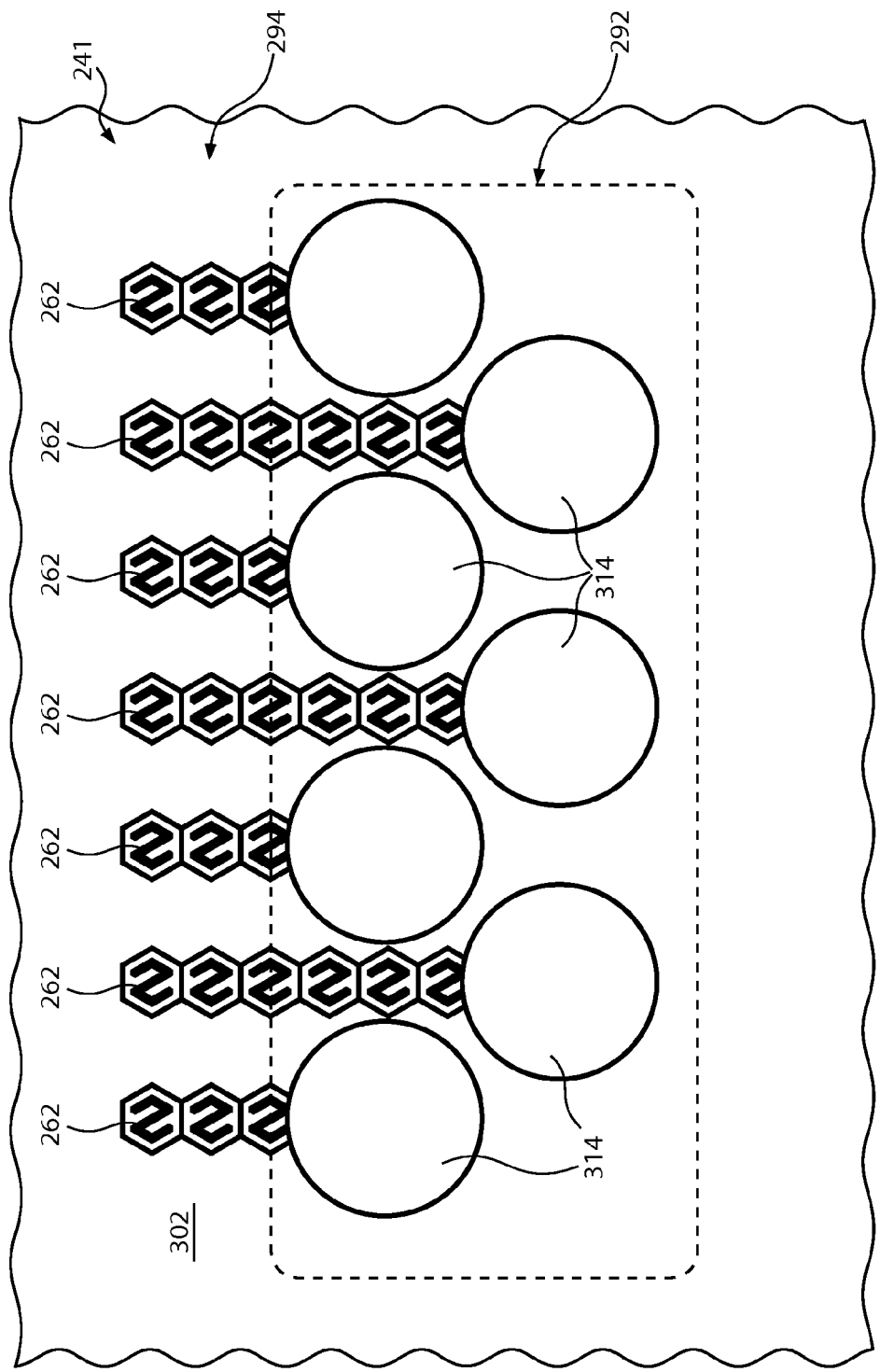
FIG. 14 includes an illustration of a top view of the relationships between the conductive bumps, the vias, and the different regions of the substrate.

FIG. 14 includes a top view of the workpiece after forming the conductive bumps 314. The view in FIG. 14 is from the opposite side of the workpiece as compared to the view in FIG. 8. The conductive bumps 314 cover the sets of segments 284 (FIG. 8). The conductive bumps 314 are within the region 292 that is recessed as compared to the region 294.

Figure 15:
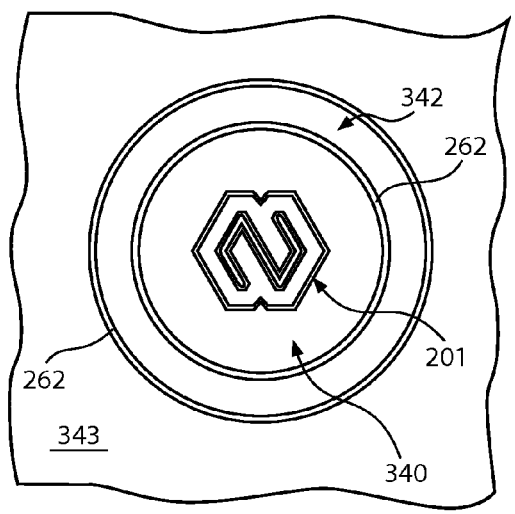
FIG. 15 includes an illustration of a top view of a via and a coaxial conductive in accordance with an embodiment.

In an embodiment, an n-axial connector can include n conductive members, where n is a whole number that is at least two. In another embodiment, one of the conductive members can include a unit cell or a set of unit cells, where the set of unit cells form a single conductive member. In a particular embodiment, FIG. 15 includes an illustration of a coaxial conductive member 342 that surrounds the unit cell 201. The unit cell 201 is located within a via 340. Insulating layers 262 are also illustrated. In another embodiment, a coaxial conductive member may surround a larger via including a plurality of unit cells. The coaxial conductive member as illustrated in FIG. 15 is smooth and circular in shape, but any number of alternate shapes (not illustrated) such as squares, octagons, including linked individual unit cells 201 or 401, could also be used. The coaxial conductive member may help to reduce noise, capacitance, or an adverse effect between one or more vias and another part of the electronic device.

Figure 16:
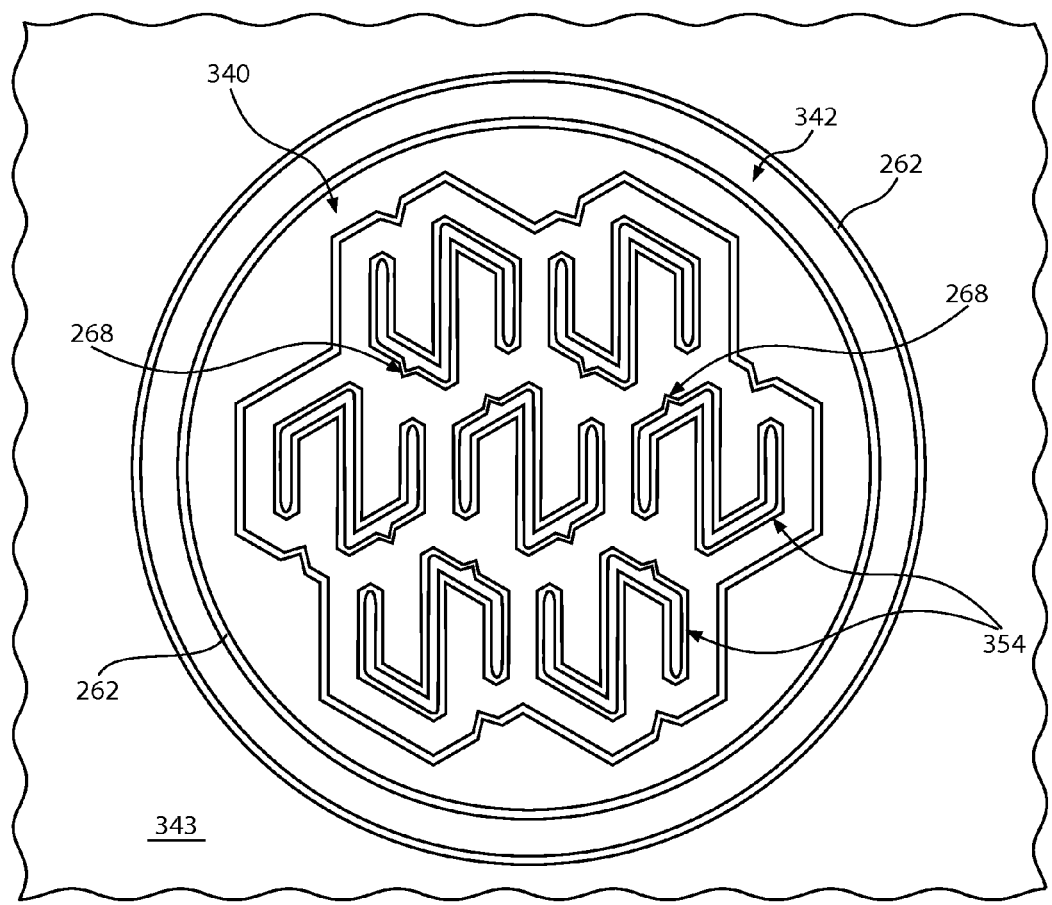
FIG. 16 includes an illustration of a top view of a via comprising features and a coaxial in accordance with another embodiment.

In another embodiment, FIG. 16 includes an illustration of a coaxial conductive member 342 that surrounds a via 340. Contained within the via 340 are generally S-shaped features 354. The S-shaped features 354 are similar with respect to the S-shaped features 454 described in FIG. 5.

The number of outwardly-extending, space-compensating elements 268 of a particular S-shaped feature 354 depends on the location of the particular generally S-shaped feature 354 within the via 340. The particular S-shaped feature 354 located closer to the substrate 343 has one outwardly-extending, space-compensating element 268, whereas another particular S-shaped feature 354 located further from the substrate 343 has two outwardly-extending, space-compensating elements 268. As previously stated, the outwardly-extending, space compensating elements 268 are configured to make distances between the substrate 343 and S-shaped features 354 more equal as compared to the substrate 343 and S-shaped features 354 in an absence of the outwardly-extending, space compensating elements 268. Additionally, the outwardly-extending, space-compensating elements further contribute to the stability of the S-shaped features 354.

In a further embodiment, the electronic device can include an interposer. The interposer can be used to route signals to different lateral positions along opposite sides of the interposer. The interposer can include an interconnect extending through at least a majority of the interposer. The interposer can further include conductive structures along opposite sides of the interposer. The conductive structures can be laterally offset from each other, allowing for lateral routing (substantially parallel to the thickness of the interposer) of electronic signals in addition to vertical routing (substantially through the thickness of the substrate). Such routing has the advantage of allowing the conductive structures on opposite sides of the interposer to have substantially different sizes. Such size difference can allow for easier alignment and better connection to terminals of a packaging substrate or other workpiece. The interposer may or may not have any electronic components, and the interposer may be at a desired thickness when processing starts. Therefore, a backgrind or polishing operation may not be needed.

The embodiments described herein are used to illustrate some potential physical designs and electronic configurations that can be used. Particular physical designs and electronic configurations selected can be selected to meet the needs or desires for a particular application. Other passive electronic components and other configurations can be used without departing from the scope of the concepts described herein.

Embodiments as described herein can allow a feature to be formed with improved mechanical stability. The mechanical stability can be determined by comparing the physical layout as designed to the actual physical structure achieved at a point during fabrication. If the width of a trench is designed to be substantially uniform along the sides of a feature, and the actual widths in the physical structure are significantly different, then the feature may be considered not mechanically stable. Alternatively, the mechanical stability can be determined by comparing the dimensions of the structure as designed to the structure as formed. If the width of a trench is designed to be substantially uniform along the sides of a feature, and the actual widths in the actual physical structure are significantly nonuniform, then the feature may be considered mechanically unstable. Alternatively, mechanical stability can be determined by comparing the dimensions of the actual physical structure at different points during fabrication. If the width of a trench changes by more than 10% during a deposition or thermal operation, then the feature may be considered mechanically unstable. Alternatively, the mechanical stability can be determined if the feature becomes twisted, rotated, bent, or otherwise changes shape during a subsequent deposition or thermal operation (other a change solely caused by the oxidation of the feature itself). If the feature significantly changes shape, then the feature may be considered mechanically unstable. Thus, a feature can be considered mechanically stable if such feature is not mechanically unstable.

Embodiments as described herein can take advantage of the vertical direction (namely depth) to allow electronic components to be formed with a relatively large surface area without occupying such area along a major surface of a die substrate. For a capacitor, a relatively large capacitance can be achieved, and the capacitor may have electrical connections along a single side or opposite sides of the die substrate. Through-substrate vias can be formed as part of a die fabrication process before a substrate is thinned. Thus, through-substrate vias can be formed without detriments that may occur if through substrate vias were to be formed after the die substrate is thinned.

Flexibility exists regarding when trenches are defined, features are formed, and when the trenches are filled, which is referred to as the trench-and-fill sequence. In an embodiment, the trench-and-fill sequence may be performed early in the process flow, such as before field isolation regions are formed. In another embodiment, the trench-and-fill sequence may be performed after forming field isolation regions and before forming any permanent layers or structures over a major surface of the substrate, for example, before a gate dielectric or gate electrode layer is formed over the major surface. In still another embodiment, the trench-and-fill sequence may be performed before or as part of an interconnect level for the integrated circuit. After reading this specification, skilled artisans will appreciate that the trench-and-fill sequence can be integrated into a process flow for many different applications.

Embodiments described herein can also help to allow handling of electronic devices by machines. The relatively thicker areas of the substrate allow for proper mechanical support and resistance to bowing or other undesired change in shape. The relatively thinner areas of the substrate allow through-semiconductor vias to be formed without the trenches having to extend nearly as deep. Further, the process is well suited for electronic devices that already have a desired or needed thickness that cannot be further thinned. The localized thinning within a region allows the through-semiconductor vias to be formed more readily.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items listed below.

Item 1. An interposer can include a substrate and an interconnect. The substrate can have a first surface and a second surface opposite the first surface. The interconnect can extending through at least a majority of the substrate. The interconnect can also have a first via at a first terminal end lying adjacent to the first surface and a second via at a second terminal end lying adjacent to the second surface, wherein the first terminal end is offset laterally from the second terminal end.

Item 2. The interposer of Item 1, wherein the interconnect further includes distinct segments, wherein each distinct segment is contiguous with other distinct segments.

Item 3. The interposer of Item 2, wherein the first via includes only one distinct segment and the second via includes a set of distinct segments.

Item 4. The interposer of Item 3, wherein each distinct segment comprises a feature that is disposed within a trench within the substrate and spaced apart from the substrate. The feature can extend along at least most of the depth of the trench. At the same elevation, the feature and the substrate comprise substantially a same composition and crystal orientation.

Item 5. The interposer of Item 3 further includes another set of distinct segments configured to laterally connect the first via to the second via.

Item 6. The interposer of Item 3, wherein, from a top view the feature includes a center segment, a first segment, a first intermediate segment, a second segment, and a second intermediate segment. The center segment can have a first end and a second end opposite the first end. The first intermediate segment can have a first proximal end and a first distal end. The first intermediate segment can be disposed between the first proximal end of the first segment and the first end of the center segment. The second segment can have a second proximal end and a second distal end. The second intermediate segment can be disposed between the second proximal end of the second segment and the second end of the center segment.

Item 7. The interposer of Item 1 further includes additional interconnects, wherein, from a top view, the interconnects are staggered.

Item 8. The interposer of Item 1, wherein the first conductive structure includes a bump or solder ball, and the second conductive structure includes a conductive plug or another interconnect.

Item 9. The interposer of Item 1, wherein the substrate includes a first region having a first thickness, and a second region having a second thickness different from the first thickness.

Item 10. An electronic device can include a die substrate, first features, a first conductive structure, and a second conductive structure, wherein the electronic device comprises an n-axial feedthrough, wherein n is a whole number that is at least 2, and the n-axial feedthrough includes the first conductive structure and the second conductive structure. The die substrate can define a first trench and a second trench spaced apart from the first trench, wherein each of the first and second trenches has a depth that extends substantially completely through the die substrate. The first features can be disposed within the first trench and extend along at least most of the depth of the first trench. The first conductive structure can be disposed within the first trench, wherein the first conductive structure is disposed between the first features and the die substrate. The second conductive structure can be disposed within the second trench and surrounds the first conductive structure, wherein the second conductive structure extends along at least most of the depth of the first trench.

Item 11. The electronic device of Item 10, wherein at a same elevation, the first features and the die substrate comprise substantially a same composition and crystal orientation.

Item 12. The electronic device of Item 10, wherein each of a particular first feature and the die substrate has an outwardly-extending, space-compensating element.

Item 13. The electronic device of Item 12, wherein a number of outwardly-extending, space-compensating elements of the particular first feature depends on the location of the particular first feature within the first trench.

Item 14. The electronic device of Item 13, wherein the particular first feature located closer to the die substrate has one outwardly-extending, space-compensating element, and another particular first feature located further from the die substrate has two outwardly-extending, space-compensating elements Item 15. The electronic device of Item 12, wherein the outwardly-extending, space-compensating elements are configured to make distances between the first trench and the particular first feature and between the particular first features more equal as compared to the particular first feature and the first trench in an absence of the outwardly-extending, space-compensating elements.

Item 16. A process of forming an electronic device can include provide a die substrate having a first surface and a second surface opposite the first surface, etching the die substrate along the first surface to define a trench, forming a via within the trench, removing a portion of the die substrate along the second surface to define a first region of the die substrate, forming a first conductive structure adjacent to the first region and electrically connected to the via, and forming a second conductive structure adjacent to the second region and electrically connected to the via. The thickness of the die substrate removed is at least approximately 1.1% of the thickness of the die substrate within the first region prior to removing the portion. The first conductive structure has an uppermost point that lies at an elevation higher than a second region of the die substrate, wherein removing the portion of the die substrate does not significantly remove the die substrate within the second region.

Item 17. The process of Item 16, wherein removing the portion of the die substrate is performed using an isotropic etch Item 18. The process of Item 17, wherein etching the die substrate is performed such that the trench has a first width adjacent to where the first conductive structure will be formed and a second width adjacent to where the second conductive structure will be formed.

Item 19. The process of Item 18 further includes forming an electronic component at least partly within the die substrate along the second side of the die substrate. The process further includes forming an interconnect that is electrically connected to the electronic component, wherein the interconnect is spaced apart from and formed from a same interconnect level as the second conductive structure Item 20. The process of Item 16, wherein forming the first conductive structure comprises forming a conductive layer and forming a solder layer.

In a first aspect, an electronic device can include a substrate including a first region having a first thickness, and a second region having a second thickness different from the first thickness. The electronic device can also include a via within the first region and extending through at least a majority of the first thickness. The electronic device can yet further include a first conductive structure adjacent to the first region and electrically connected to the via, wherein a combined thickness of the first thickness and a thickness of the first conductive structure is thicker than the second thickness.

In an embodiment of the first aspect, the electronic device further includes a second conductive structure electrically connected to the via, wherein the second conductive structure lies adjacent to a surface of the substrate opposite another surface of the substrate that is adjacent to the first conductive structure. In a particular embodiment, the first conductive structure includes a bump or a solder ball, and the second conductive structure include a conductive plug or an interconnect. In another particular embodiment, from a cross sectional view, the first conductive structure is laterally offset from the second conductive structure such that, in a direction substantially perpendicular to the other surface of the substrate, the first conductive structure does not directly overlie the second conductive structure or the second conductive structure does not directly overlie the first conductive structure. In a more particular embodiment, from a top view, the via includes series of distinct segments between the portions of the via that are directly above or directly below the first and second conductive structures.

In a further embodiment of the first aspect, a percentage of a thickness of the substrate within the first region to another thickness of the substrate within the second region is no greater than approximately 99%. In still a further embodiment, the first thickness is less than the second thickness. In a particular embodiment, the first thickness is at least approximately 50 microns, and the second thickness is no greater than approximately 200 microns. In yet a further embodiment, the substrate includes a semiconductor material. In another embodiment, the substrate includes a main body and a remaining portion spaced apart from the main body, wherein the remaining portion is contained within the via.

In a second aspect, a process of forming an electronic device can include providing a substrate having a first surface and a second surface opposite the first surface, etching the substrate along the first surface to define a trench, and forming a via within the trench. The process can also include removing a portion of the substrate along the second surface to define a first region of the substrate, wherein a thickness of the substrate removed is at least approximately 1.1% of a thickness of the substrate within the first region prior to removing the portion. The process can further include forming a first conductive structure adjacent to the first region and electrically connected to the via, wherein the first conductive structure has an uppermost point that lies at an elevation higher than a second region of the substrate, wherein removing the portion of the substrate does not significantly remove the substrate within the second region.

In an embodiment of the second aspect, removing the portion of the substrate is performed using an isotropic etch. In another embodiment, forming the first conductive structure includes forming a conductive layer and forming a solder layer. In still another embodiment, the process further includes flowing the solder layer before attaching the first conductive structure to a packaging substrate. In still yet another embodiment, the process further includes forming a second conductive structure adjacent to the second surface and electrically connected to the second conductive structure. In a particular embodiment, etching the substrate is performed such that the trench has a first width adjacent to where the first conductive structure will be formed and a second width adjacent to where the second conductive structure will be formed. In another particular embodiment, the process further includes forming an electronic component at least partly within the substrate along the second side of the substrate. In a more particular embodiment, the process further includes forming an interconnect that is electrically connected to the component, wherein the interconnect is spaced apart from and formed from a same interconnect level as the second conductive structure.

In a third aspect, an interposer can include a substrate having a first surface and a second surface opposite the first surface, wherein the substrate has a first region having a first thickness, a second region having a second thickness that is thicker than the first thickness, and the substrate has a central elevation along a central plane between the first and second surfaces. The interposer can also include a via within the first region and extending through at least a majority of the first thickness, and a first conductive structure along the first surface and electrically connected to the via, wherein an exposed surface of the conductive structure lies at a first elevation as measured from the central plane, the second surface lies at a second elevation as measured from the central plane, and the first elevation is greater than the second elevation. The interposer can still further include a second conductive structure along the second surface and electrically connected to the via.

In an embodiment of the third aspect, the interposer does not include an electronic component, the first thickness is in a range between approximately 50% to approximately 90% of the second thickness, the first conductive structure includes a bump or a solder ball and has a thickness of at least approximately 5 microns, and the second conductive structure has a thickness less than approximately 3 microns.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An interposer comprising:
    a substrate having a first surface and a second surface opposite the first surface,
    an interconnect extending through at least a majority of the substrate, wherein the interconnect has a first via at a first terminal end lying adjacent to the first surface and a second via at a second terminal end lying adjacent to the second surface, wherein the first terminal end is offset laterally from the second terminal end, and wherein the first and second vias are disposed within the substrate so as to be laterally contiguous therein.

2. The interposer of claim 1, wherein the interconnect further comprises distinct segments, wherein each distinct segment is contiguous with other distinct segments.

3. The interposer of claim 2, wherein the first via comprises only one distinct segment and the second via comprises a set of distinct segments.

4. The interposer of claim 3, wherein each distinct segment comprises a feature that is disposed within a trench within the substrate and spaced apart from the substrate, wherein:
    the feature extends along at least most of the depth of the trench; and
    at the same elevation, the feature and the substrate comprise substantially a same composition and crystal orientation.

5. The interposer of claim 4, wherein, from a top view, the feature includes:
    a center segment having a first end and a second end opposite the first end;
    a first segment having a first proximal end and a first distal end;
    a first intermediate segment disposed between the first proximal end of the first segment and the first end of the center segment;
    a second segment having a second proximal end and a second distal end; and
    a second intermediate segment disposed between the second proximal end of the second segment and the second end of the center segment.

6. The interposer of claim 3, further comprising another set of distinct segments configured to laterally connect the first via to the second via.

7. The interposer of claim 1, further comprising additional interconnects, wherein, from a top view, the interconnects are staggered.

8. The interposer of claim 1, wherein the substrate includes a first region having a first thickness, and a second region having a second thickness different from the first thickness.

9. An electronic device comprising:
    a die substrate defining a first trench and a second trench spaced apart from the first trench, wherein each of the first and second trenches has a depth that extends substantially completely through the die substrate;
    first features that are disposed within the first trench and extend along at least most of the depth of the first trench, each of a particular first feature having an outwardly-extending, space compensating element;
    a first conductive structure that is disposed within the first trench, wherein the first conductive structure is disposed between the first features and the die substrate; and
    a second conductive structure that is disposed within the second trench and surrounds the first conductive structure, wherein the second conductive structure extends along at least most of the depth of the first trench,
    wherein the electronic device comprises an n-axial feedthrough, wherein n is a whole number that is at least 2, and the n-axial feedthrough includes the first conductive structure and the second conductive structure.

10. The interposer of claim 9, wherein the first conductive structure includes a bump or solder ball, and the second conductive structure includes a conductive plug or another interconnect.

11. The electronic device of claim 9, wherein the die substrate has an outwardly-extending, space-compensating element.

12. The electronic device of claim 11, wherein at a same elevation, the first features and the die substrate comprise substantially a same composition and crystal orientation.

13. The electronic device of claim 11, wherein a number of outwardly-extending, space-compensating elements of the particular first feature depends on the location of the particular first feature within the first trench.

14. The electronic device of claim 13, wherein the particular first feature located closer to the die substrate has one outwardly-extending, space-compensating element, and another particular first feature located further from the die substrate has two outwardly-extending, space-compensating elements.

15. The electronic device of claim 11, wherein the outwardly-extending, space-compensating elements are configured to make distances between the first trench and the particular first feature and between the particular first features more equal as compared to the particular first feature and the first trench in an absence of the outwardly-extending, space-compensating elements.

16. A process of forming an electronic device comprising:
    providing a die substrate having a first surface and a second surface opposite the first surface;
    etching the die substrate along the first surface to define a trench;
    forming a via within the trench;
    removing a portion of the die substrate along the second surface to define a first region of the die substrate, wherein a thickness of the die substrate removed is at least approximately 1.1% of the thickness of the die substrate within the first region prior to removing the portion;
    forming a first conductive structure adjacent to the first region and electrically connected to the via, wherein the first conductive structure has an uppermost point that lies at an elevation higher than a second region of the die substrate, wherein removing the portion of the die substrate does not significantly remove the die substrate within the second region; and
    forming a second conductive structure adjacent to the second region and electrically connected to the via.

17. The process of claim 16, wherein removing the portion of the die substrate is performed using an isotropic etch.

18. The process of claim 17, wherein etching the die substrate is performed such that the trench has a first width adjacent to where the first conductive structure will be formed and a second width adjacent to where the second conductive structure will be formed.

19. The process of claim 18, further comprising:
    forming an electronic component at least partly within the die substrate along the second side of the die substrate; and forming an interconnect that is electrically connected to the electronic component, wherein the interconnect is spaced apart from and formed from a same interconnect level as the second conductive structure.

20. The process of claim 16, wherein forming the first conductive structure comprises forming a conductive layer and forming a solder layer.

\* \* \* \* \*